United States Patent
Foss

(10) Patent No.: US 10,153,383 B2
(45) Date of Patent: Dec. 11, 2018

(54) SOLAR STRING POWER POINT OPTIMIZATION

(75) Inventor: Andrew Foss, San Jose, CA (US)

(73) Assignee: NATIONAL SEMICONDUCTOR CORPORATION, Santa Clara, CA (US)

( * ) Notice: Subject to any disclaimer, the term of this patent is extended or adjusted under 35 U.S.C. 154(b) by 1560 days.

(21) Appl. No.: 12/403,339

(22) Filed: Mar. 12, 2009

(65) Prior Publication Data

US 2010/0126550 A1    May 27, 2010

Related U.S. Application Data

(60) Provisional application No. 61/116,998, filed on Nov. 21, 2008.

(51) Int. Cl.
*H01L 31/02* (2006.01)
*G05F 1/67* (2006.01)
*H02J 3/38* (2006.01)

(52) U.S. Cl.
CPC .......... *H01L 31/02021* (2013.01); *G05F 1/67* (2013.01); *H02J 3/383* (2013.01); *Y02E 10/563* (2013.01); *Y02E 10/58* (2013.01)

(58) Field of Classification Search
CPC ....... Y02E 10/56; Y02E 10/563; Y02E 10/58; H01L 31/02002; H01L 31/02008; H01L 31/0201
See application file for complete search history.

(56) References Cited

U.S. PATENT DOCUMENTS

| | | |
|---|---|---|
| 3,740,636 A | 6/1973 | Hogrefe et al. |
| 4,129,788 A | 12/1978 | Chavannes |
| 4,189,765 A | 2/1980 | Kotalik et al. |
| 4,280,097 A | 7/1981 | Carey et al. |
| 4,688,538 A | 8/1987 | Ward et al. |
| 4,725,740 A | 2/1988 | Nakata |
| 5,284,719 A | 2/1994 | Landau et al. |
| 5,307,006 A | 4/1994 | Rankin et al. |
| 5,408,404 A | 4/1995 | Mitchell |
| 5,412,308 A | 5/1995 | Brown |
| 5,528,125 A | 6/1996 | Marshall et al. |
| 5,600,247 A | 2/1997 | Matthews |
| 5,604,430 A | 2/1997 | Decker et al. |

(Continued)

FOREIGN PATENT DOCUMENTS

| | | |
|---|---|---|
| EP | 1 239 573 A1 | 9/2002 |
| ES | 2 249 147 B1 | 5/2007 |

(Continued)

OTHER PUBLICATIONS

"PV FAQs", U.S. Department on Energy, Jan. 2004, 2 pages.

(Continued)

*Primary Examiner* — Susan D Leong
*Assistant Examiner* — Dujuan A Horton
(74) *Attorney, Agent, or Firm* — Andy Viger; Charles A. Brill; Frank D. Cimino

(57) ABSTRACT

An apparatus and method that controls the power produced by a string of solar cells, enabling the string to operate at its maximum power point when connected to a bus that operates at an externally controlled voltage. The apparatus and method can also be used to increase or decrease the output power of a string to any desired operating point.

20 Claims, 4 Drawing Sheets

(56) References Cited

U.S. PATENT DOCUMENTS

| | | |
|---|---|---|
| 5,659,465 A | 8/1997 | Flack et al. |
| 5,666,040 A | 9/1997 | Bourbeau |
| 5,669,987 A | 9/1997 | Takehara et al. |
| 5,747,967 A | 5/1998 | Muljadi et al. |
| 5,751,120 A | 5/1998 | Zeitler et al. |
| 5,892,354 A | 4/1999 | Nagao et al. |
| 6,169,678 B1 | 1/2001 | Kondo et al. |
| 6,184,656 B1 | 2/2001 | Karunasiri et al. |
| 6,281,485 B1 | 8/2001 | Siri |
| 6,331,670 B2 | 12/2001 | Takehara et al. |
| 6,369,576 B1 | 4/2002 | Matthews et al. |
| 6,608,404 B2 | 8/2003 | Schienbein et al. |
| 6,633,823 B2 | 10/2003 | Bartone et al. |
| 6,636,431 B2 | 10/2003 | Seki et al. |
| 6,717,519 B2 | 4/2004 | Kobayashi et al. |
| 6,750,391 B2 | 6/2004 | Bower et al. |
| 6,844,739 B2 | 1/2005 | Kasai et al. |
| 6,850,820 B2 | 2/2005 | Tajima |
| 6,966,184 B2 | 11/2005 | Toyomura et al. |
| 6,975,522 B2 | 12/2005 | Asano |
| 6,984,967 B2 | 1/2006 | Notman |
| 7,046,527 B2 | 5/2006 | West |
| 7,477,080 B1 | 1/2009 | Fest |
| 7,566,828 B2 | 7/2009 | Sasaki |
| 7,605,498 B2 | 10/2009 | Ledenev et al. |
| 7,701,083 B2 | 4/2010 | Savage |
| 7,723,865 B2 | 5/2010 | Kitanaka |
| 7,759,903 B2 | 7/2010 | Kamata |
| 7,843,085 B2 | 11/2010 | Ledenev et al. |
| 7,925,552 B2 | 4/2011 | Tarbell et al. |
| 2002/0038667 A1 | 4/2002 | Kondo et al. |
| 2003/0201674 A1 | 10/2003 | Droppo et al. |
| 2004/0135545 A1 | 7/2004 | Fowler et al. |
| 2005/0105224 A1 | 5/2005 | Nishi |
| 2005/0257827 A1 | 11/2005 | Gaudiana et al. |
| 2006/0017327 A1 | 1/2006 | Siri et al. |
| 2006/0149607 A1 | 7/2006 | Sayers et al. |
| 2006/0162772 A1 | 7/2006 | Presher, Jr. et al. |
| 2006/0171182 A1 | 8/2006 | Siri et al. |
| 2006/0174939 A1* | 8/2006 | Matan ............ 136/293 |
| 2006/0176036 A1 | 8/2006 | Flatness et al. |
| 2007/0024257 A1 | 2/2007 | Boldo |
| 2007/0137688 A1 | 6/2007 | Yoshida |
| 2007/0164612 A1 | 7/2007 | Wendt et al. |
| 2008/0013347 A1 | 1/2008 | Deng et al. |
| 2008/0087321 A1 | 4/2008 | Schwartzman |
| 2008/0097655 A1 | 4/2008 | Hadar et al. |
| 2008/0143188 A1 | 6/2008 | Adest et al. |
| 2008/0147335 A1 | 6/2008 | Adest et al. |
| 2008/0150366 A1 | 6/2008 | Adest et al. |
| 2008/0278983 A1 | 11/2008 | Park |
| 2009/0039852 A1 | 2/2009 | Fishelov et al. |
| 2009/0140719 A1 | 6/2009 | Hasenfus |
| 2009/0242011 A1 | 10/2009 | Proisy et al. |
| 2009/0283128 A1 | 11/2009 | Zhang et al. |
| 2009/0283129 A1 | 11/2009 | Foss |
| 2009/0284078 A1 | 11/2009 | Zhang et al. |
| 2009/0284232 A1 | 11/2009 | Zhang et al. |
| 2009/0284240 A1 | 11/2009 | Zhang et al. |
| 2009/0284998 A1 | 11/2009 | Zhang et al. |
| 2009/0289502 A1 | 11/2009 | Batarseh et al. |
| 2010/0001587 A1 | 1/2010 | Casey et al. |
| 2010/0269883 A1 | 10/2010 | Sarhan |
| 2010/0288327 A1 | 11/2010 | Lisi et al. |
| 2010/0327659 A1 | 12/2010 | Lisi et al. |

FOREIGN PATENT DOCUMENTS

| | | |
|---|---|---|
| JP | 07-234733 A | 9/1995 |
| JP | 08-123563 A | 5/1996 |
| JP | 08-314555 A | 11/1996 |
| JP | 10014105 A | 1/1998 |
| JP | 10155240 A | 6/1998 |
| JP | 11098679 A | 4/1999 |
| JP | 2000112545 A | 4/2000 |
| JP | 2000116010 A | 4/2000 |
| JP | 2003134661 A | 5/2003 |
| JP | 2003216255 A | 7/2003 |
| JP | 2005-151662 | 6/2005 |
| JP | 2005243852 A | 9/2005 |
| JP | 2005252172 A | 9/2005 |
| JP | 2006134118 A | 5/2006 |
| JP | 2006216660 A | 8/2006 |
| JP | 2006-320149 | 11/2006 |
| JP | 2007-133765 | 5/2007 |
| KR | 100757320 B1 | 9/2007 |
| KR | 20080010116 A | 1/2008 |
| KR | 100886891 B1 | 3/2009 |
| KR | 1020090133036 A | 12/2009 |
| WO | WO 2007/084196 A2 | 7/2007 |

OTHER PUBLICATIONS

"Perspectives of Concentrating Solar Power", Renewable Energy India 2008 Expo, Aug. 22, 2008, 16 pages.

"APEC 2008, 23rd Annual Applied Power Electronics Conference and Exposition", vol. 1, Seminars 1-6, Feb. 24-28, 2008, Austin, Texas, 89 pages.

Yunwei Li, et al., "Design, Analysis, and Real-Time Testing of a Controller for Multibus Microgrid System", IEEE Transactions on Power Electronics, vol. 19, No. 5, Sep. 2004, p. 1195-1204.

R.H. Lasseter, "MicroGrids", 2002 IEEE Power Engineering Society Winter Meeting, vol. 1, Jan. 2002, p. 305-308.

John Stevens, "Development of Sources and a Testbed for CERTS Microgrid Testing", 2004 IEEE Power Engineering Society General Meeting, Jun. 2004, p. 1-2.

Mike Barnes, et al., "Real-World MicroGrids—An Overview", 2007 IEEE SoSE International Conference, Apr. 2007, p. 1-8.

Paolo Piagi, et al., "Autonomous Control of Microgrids", IEEE Power Engineering Society General Meeting, Jun. 2006, 8 pages.

Y. Zoka, et al., "An Interaction Problem of Distributed Generators Installed in a MicroGrid", 2004 IEEE International Conference on Electric Utility Deregulation, Restructuring and Power Technologies (DRPT2004), Apr. 2004, Hong Kong, p. 795-799.

M.P.F. Hommelberg, et al., "Distributed Control Concepts using Multi-Agent technology and Automatic Markets; An indispensable feature of smart power grids", 2007 IEEE Power Engineering Society General Meeting, Jun. 2007, p. 1-7.

Notification of Transmittal of the International Search Report and the Written Opinion of the International Searching Authority, or the Declaration dated Dec. 17, 2009 in connection with PCT Application No. PCTfUS2009f044033.

Guo Heng, et al., "A Novel Maximum Power Point Tracking Strategy for Stand-along Solar Pumping Systems", 2005 IEEE, 5 pages.

Debosmita Das, et al., "An Optimal Design of a Grid Connected Hybrid Wind/PhotovoltaicrFuel Cell System for Distributed Energy Production", 2005 IEEE, p. 2499-2504.

Claus Bjerge, et al., "How to run an offshore wind farm like a conventional power plant", www.modernpowersystems.com, Jan. 2007, 4 pages.

Steven Anderson, "Remote . . . But Not Economically Out of Reach", Power and Energy, Dec. 15, 1986, 5 pages.

Qihi Liu, et al., "Novel Modeling and Control of Doubly-Fed Variable-Speed Constant-Frequency Wind Power Generator", The 33rd Annual Conference of the IEEE Industrial Electronics Society (IECON), Nov. 5-8, 2007, p. 1521-1626.

Casisheng Wang, "Modeling and Control of Hybrid Wind/Photovoltaic/Fuel Cell Distributed Generation Systems", Jul. 2006, Montana State University, 403 pages.

Notification of Transmittal of the International Search Report and the Written Opinion of the International Searching Authority, or the Declaration dated Dec. 23, 2009 in connection with International Patent Application No. PCTfUS2009f044036.

Jianhui Zhang, et al., "Active Cell and Module Balancing for Batteries or Other Power Supplies", U.S. Appl. No. 12/882,781, filed Sep. 15, 2010.

(56) References Cited

OTHER PUBLICATIONS

Ramesh Khanna, "Solar-Powered Battery Charger and Related System and Method", U.S. Appl. No. 12/589,984, flied Oct. 30, 2009.
Andrew Foss, "System and Method for Solar Panel Array Analysis", U.S. Appl. No. 12/386,958, filed Apr. 24, 2009.
Gianpaolo Lisi, et al., "Off-Grid LED Street Lighting System With Multiple Panel-Storage Matching", U.S. Appl. No. 12/925,110, filed Oct. 14, 2010.
Notification of Transmittal of the International Search Report and the Written Opinion of the International Searching Authority, or the Declaration dated Dec. 24, 2009 in connection with International Patent Application No. PCTfUS2009f044019.
Carlos Meza, et al., "Boost-Buck inverter variable structure control for grid-connected photovoltaic systems", 2005 IEEE, p. 1318-1321.
Mikihiko Matsui, et al., "A New Maximum Photovoltaic Power Tracking Control Scheme Based on Power Equilibrium at DC Link", 1999 IEEE, p. 804-809.
Notification of Transmittal of the International Search Report and the Written Opinion of the International Searching Authority, or the Declaration dated Dec. 23, 2009 in connection with PCT Application No. PCTfUS2009f044027.
Notification of Transmittal of the International Search Report and the Written Opinion of the International Searching Authority, or the Declaration dated Dec. 23, 2009 in connection with PCT Application No. PCT/US2009f044015.
Jianhui Zhang, et al., "Method and System for Providing Central Control in a Energy Generating System", U.S. Appl. No. 12/152,479, filed May 14, 2008.
Stephen W. Moore, et al., "A Review of Cell Equalization Methods for Lithium Ion and Lithium Polymer Battery Systems", Society of Automotive Engineers, Inc., 2001, 5 pages.
Sihua Wen, "Cell balancing buys extra run time and battery life", Analog Applications Journal, 2009, 8 pages.
"Five to Ten Series Cell Lithium-Ion or Lithium-Polymer battery Protector and Analog Front End", Texas Instruments, Jun. 2008, 60 pages.
"Li-Ion, NiMh Battery Measuring, Charge Balancing and Power-supply Circuit", Atmel Corporation, Oct. 2009, 55 pages.
Werner Rößler, "Boost battery performance with active charge-balancing", EE Times-Asia, Jul. 16-31, 2008, p. 1-3.
Notification of Transmittal of the International Search Report and the Written Opinion of the International Searching Authority, or the Declaration dated Dec. 31, 2010 in connection with PCT Application No. PCTfUS2010f031462.
Notification of Transmittal of the International Search Report and the Written Opinion of the International Searching Authority, or the Declaration dated Jan. 3, 2011 in connection with PCT Application No. PCTfUS2010f031505.
Notification of Transmittal of the International Search Report and the Written Opinion of the International Searching Authority, or the Declaration dated Jan. 13, 2011 in connection with PCT Application No. PCTfUS2010f034783.
"Micropower Synchronous, Buck-Boost DC/DC Converter", MiniLogic Device Corporation, Sep. 2005, p. 1-13.
Geoffrey R. Walker, et al., "Cascaded DC-DC Converter Connection of Photovoltaic Modules", IEEE Transactions on Power Electronics, vol. 19, No. 4, Jul. 2004, p. 1130-1139.
Office Action dated Nov. 25, 2011 in connection with U.S. Appl. No. 12/272,990.
Office Action dated Sep. 21, 2011 in connection with U.S. Appl. No. 12/456,777.
Office Action dated Aug. 30, 2011 in connection with U.S. Appl. No. 12/386,958.
Office Action dated Dec. 9, 2011 in connection with U.S. Appl. No. 12/454,244.
Office Action dated Dec. 30, 2011 in connection with U.S. Appl. No. 12/456,776.
Office Action dated Jan. 25, 2012 in connection with U.S. Appl. No. 12/454,136.

\* cited by examiner

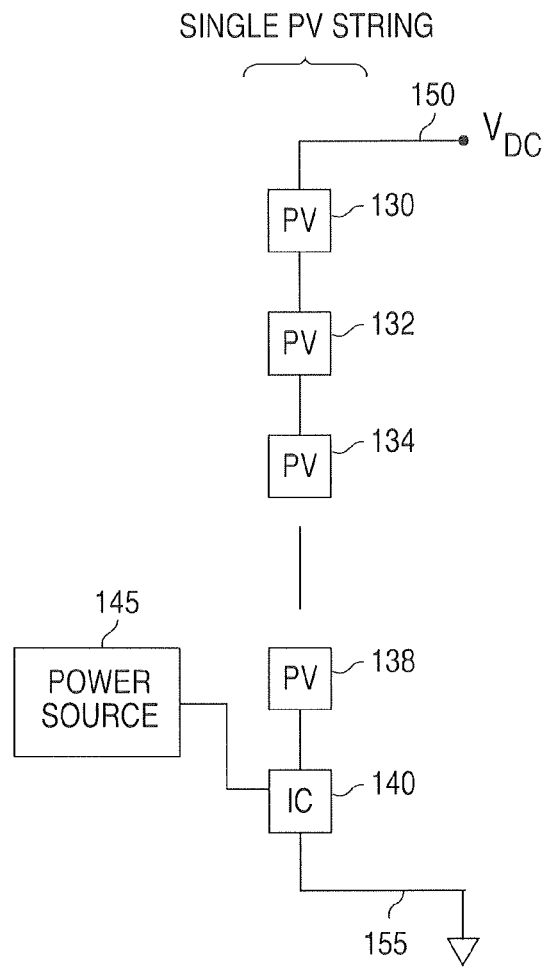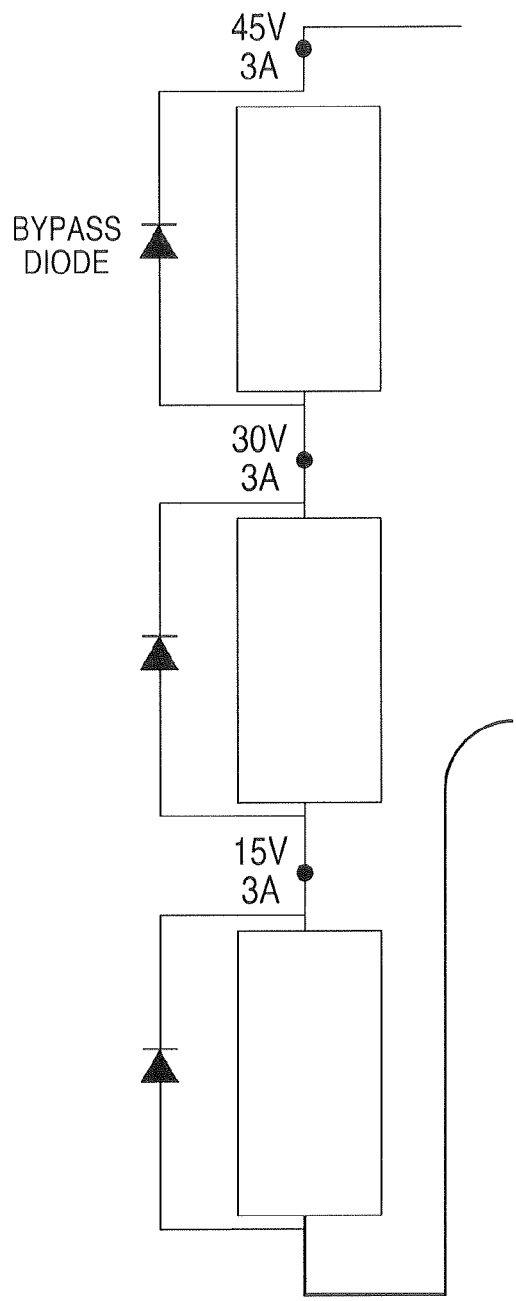
FIG. 1B
FIG. 4

SOLAR STRING POWER POINT OPTIMIZATION

RELATED APPLICATIONS

This application claims priority benefit from U.S. provisional patent application No. 61/116,998, filed on Nov. 21, 2008, which is incorporated herein by reference.

TECHNICAL FIELD

The disclosure is related to apparatus and methods for controlling the performance of solar power generation systems.

BACKGROUND

Photovoltaic solar power generation systems are made up of photovoltaic "cells". Photovoltaic cells are semiconductor devices that convert light directly into energy. When light shines on a PV cell, a voltage develops across the cell, and when connected to a load, a current flows through the cell. The voltage and current vary with several factors, including the physical size of the cell, the amount of light shining on the cell, the temperature of the cell, and external factors.

PV cells exhibit voltage and current characteristics according to their I-V curve, an example of which is shown in FIG. 3. When they are not connected to a load, the voltage across their terminals is their open circuit voltage, Voc; when their terminals are connected together to form a short circuit, they generate their short circuit current, Isc. In both cases, since power is given by voltage multiplied by current, they generate no power. They generate their maximum power when operating at their maximum power point (MPP).

Because power is maximized when cells operate at their MPP, circuits exist that perform Maximum Power Point Tracking (MPPT). These circuits adjust the voltage or current at which cells operate, measure their output power, and seek those voltage and current values at which power output is maximized. Many MPPT algorithms exist.

Cells can be connected in series to increase output voltage, and in parallel to increase current. To generate substantial power at convenient voltages, PV power generation systems are often comprised of strings of series-connected cells, connected in parallel. We refer to these parallel-connected strings herein as "arrays".

As a convenience, strings of cells are generally packaged in "modules", made up of one or more series-connected cells, mounted in a frame of aluminum or other material, with a protective covering of glass or other transparent material. Therefore photovoltaic "arrays" often consist of one or more series-connected modules connected in parallel.

An "inverter" is a device that converts DC power to AC power for attachment to the electricity grid. Typically, one inverter is connected to an array of many parallel-connected strings of modules. Most inverters contain MPPT circuitry; max power point tracking of the array is generally done by the inverter.

Since cells generate their maximum power at their maximum power point, it follows that arrays generate their maximum power when all cells comprising the array operate at their maximum power point.

Many conditions exist in today's PV solar power generating systems that cause power to be lost due to cells not operating at their maximum power point. Common conditions include shading, soiling, corrosion and aging. Lacking is an effective, inexpensive means to enable arrays to produce as much power as possible by ensuring that as many cells as possible operate as close as possible to their maximum power point.

We discuss one common cause of power loss here: partial string impairment.

When a fraction of the cells in a series string is impaired, the impaired cells do not generate as much current as the other, normally operating cells. Because they are in series, however, they must accommodate the full current. One way they can do that is to allow a negative voltage to develop. When this happens, the impaired cells are actually dissipating energy, in the form of heat, rather than generating it. This heat dissipation can cause cell damage. To avoid this damage, most modern modules are equipped with bypass diodes. Bypass diodes are diodes connected in parallel with the module's cells, in the direction to allow current to flow from what is normally the negative terminal to the positive. This is illustrated for a 3-module string, in FIG. 4. The effect of the bypass diode is to allow whatever current is being generated by the unimpaired cells to flow around the impaired cells, while limiting the negative voltage drop across the impaired cells to the very small value of the diode's forward bias.

The net effect, then, is that the current through the string is that generated by the unimpaired cells, and the voltage across the string is the sum of the unimpaired cells minus the small bypass diode drop.

In this situation, the performance of the array is affected in two ways, the first of which is simply that the impaired cells no longer generate their maximum power.

The performance of the array is also reduced because other cells in the same string as the impaired cells are forced to operate away from their maximum power point. Strings in an array all operate at the same voltage because they are connected in parallel to one another. Therefore cells connected in series with the impaired cells are forced to operate at a greater than optimal voltage because the overall voltage of their string is the same as that of the other strings.

One approach to solve this problem is to equip each module in a string with a boost circuit that boosts the module voltage as needed. This approach is expensive because a separate boost circuit is needed for each module.

Other solutions have equipped entire strings with a single boost circuit designed to boost the voltage output produced by its string to match that of a particular other "primary" string. These solutions are complex and inflexible, requiring coordination among strings.

A related problem in solar module management exists when single strings of modules are connected to a DC-to-AC inverter. A conventional inverter may include a separate maximum power point tracking circuit for each of several isolated strings connected to the inverter. However this architecture is expensive and inflexible because tracking circuits are provided when the final number of strings connected to the inverter is unknown.

Furthermore, it might be desirable for an array to throttle its power production. Consider a large array supplying power to a small electrical grid. Tremendous strain is placed on the grid when the power supplied to it varies widely and rapidly. If the array happens to be located in an area where clouds come and go frequently and rapidly, the grid can experience such strain multiple times a day. What is needed is a means by which the degree and rate at which power delivery is changed, can be controlled.

BRIEF DESCRIPTION OF THE DRAWINGS

Examples of the claimed subject matter are illustrated in the figures.

FIG. 1B shows a single string of solar modules connected in series with an injection circuit.

FIG. 4 shows a string of solar cells with three bypass diodes.

DETAILED DESCRIPTION

Figure 1A:
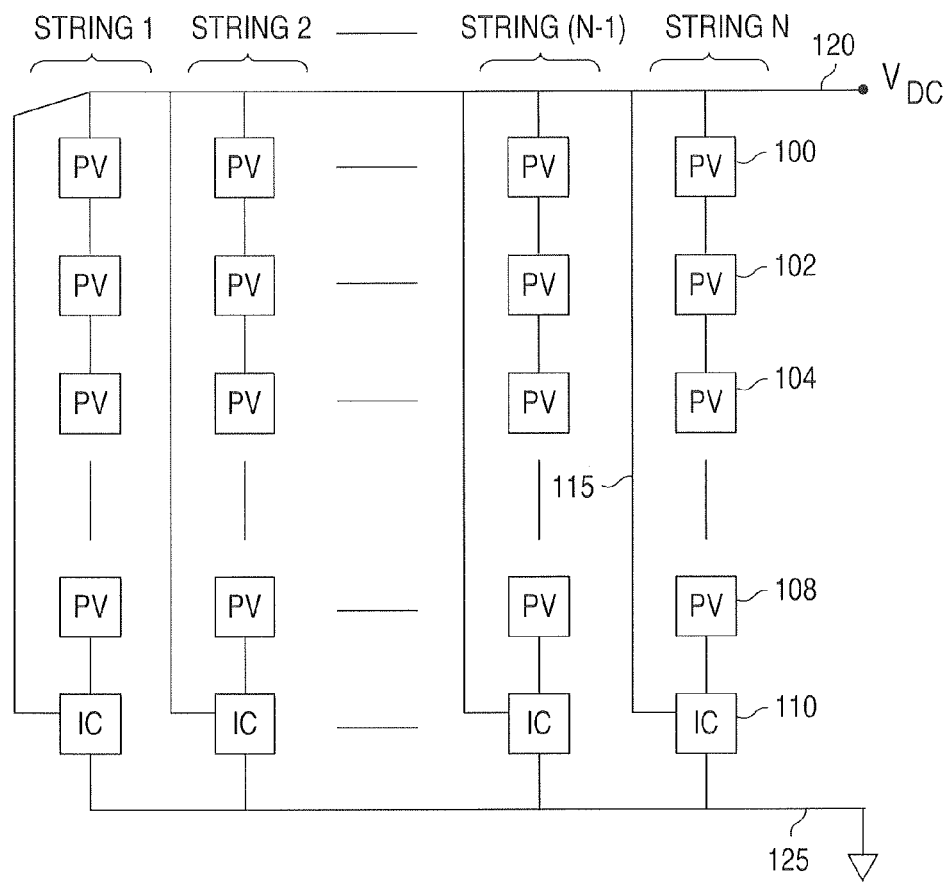
FIG. 1A shows strings of solar modules, each string having an injection circuit.
Figure 3:
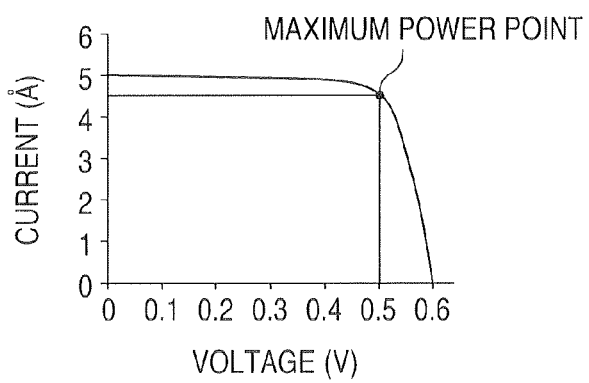
FIG. 3 shows an example of a solar cell I-V curve.

Solar cells convert sunlight directly into DC electric power. A component called an inverter converts this DC power into AC power. Normally, a solar site is interconnected with the AC power grid from a utility company. During the day, if the solar site produces more electricity than a house or building is using, the utility company may allow a credit for any excess power returned to the grid. The systems and methods described here accelerate the benefit of solar power by making solar power systems more efficient.

When a series-connected string of solar cells is connected in parallel to other similar strings, the voltage across each string is the same due to their parallel connection to one another. If one or more cells in a string are impaired, the efficiency of the entire string is degraded because the unimpaired cells are forced to operate away from their maximum power point.

In one embodiment of the invention, a boost circuit is connected to a string such that the string spans the input of the boost, and the output is connected to a DC bus to which power is delivered. FIG. 1D, for example, shows two strings ("STRING A" and "STRING B") each connected to their own boost circuit. When one or more modules in a string are impaired, the voltage across the entire string drops. The boost circuit then converts the lowered voltage to the higher DC bus voltage.

In FIG. 1D photovoltaic modules 190, 192, 194 . . . 198 are connected in series to form a string. This string is connected to input terminals S1 and S2 of boost circuit 199. Output terminals D1 and D2 of boost circuit 199 are connected to DC bus 185. The boost circuit provides a constant output at voltage $V_{DC}$ even when its input voltage varies.

In another embodiment of the invention, an injection scheme is used, as follows. Rather than converting the output voltage of a string, a small amount of energy is injected into the string to keep the string as a whole operating at its maximum power point. An injection circuit tunes the operating point of the string to keep it running at maximum power production.

An injection circuit allows power to be inserted into a string of cells without having to separate the string from other strings in an array. When a string is operating normally the circuit does not affect the string. If the voltage across one or more of the cells in the string drops, however, the circuit injects power to compensate, and enables the string to continue operating at its maximum power point. The source of power for the injection circuit can be the DC bus to which the string is connected or an external power source.

An injection circuit helps a solar array extract as much energy as possible from available sunlight when one or more cells or modules in the array are impaired by shade, dirt or other factors. The circuit uses a small amount of power, but this loss is made up for by the increased efficiency of the array and therefore increased power generated from sunlight. Furthermore, inefficiencies in the injection circuit lead to only small power dissipation because the amount of power in the circuit is much smaller than the power generated by the string to which the circuit is attached.

Injection circuits may be included with some or all of the parallel-connected strings of an array. However, injection circuits are also useful when included in single strings. An injection circuit lets a string of cells or modules provide its own maximum power point tracking independent of an inverter. Individual strings having injection circuits may then be connected to a simple inverter which need not have its own maximum power point tracking circuits.

More generally, injection circuits are useful in any situation where a string is connected to a load that constrains the voltage across the string. Examples of such situations include: parallel-connected strings in an array; single strings connected to an inverter that accepts a limited range of input voltages and/or does not provide maximum power point tracking; strings connected to a direct current (DC) power transmission system; arrays comprising strings having different numbers of cells or modules in each string; old strings rewired for connection to updated inverters; etc.

Applications involving injection circuits with parallel connected strings and with single strings are now described in more detail. We consider the case with parallel connected strings first.

FIG. 1A shows strings of solar modules connected in parallel, each string having an injection circuit. In FIG. 1A, strings of solar modules are labeled STRING 1, STRING 2, . . . , STRING (N−1), STRING N. The strings are connected in parallel to form an array of solar modules. An array may comprise any number of strings. Each string comprises a set of solar modules connected in series. An injection circuit is connected in series with the string. The injection circuit monitors the current flowing through the string and the voltage across the string. The total voltage across the string and the injection circuit is constant and set by the other strings in the array.

If the power generated by the string drops, the injection circuit injects voltage into the string until the power is maximized. Thus the injection circuit keeps the modules in the string operating at their maximum power point by eliminating the need for them to operate at higher than optimum voltages should one or more module in the string become impaired. Only one injection circuit is needed per string in an array. (Arrays may also be constructed in which some, but not all strings are equipped with injection circuits.)

In FIG. 1A, some of the components of STRING N are labeled for discussion. The string comprises photovoltaic (PV) modules 100, 102, 104, . . . , 108; injection circuit 110 is connected in series with the modules. Strings may contain any number of modules, however, each string requires only one injection circuit (IC).

The injection circuit requires a source of power. In the example illustrated in FIG. 1A, injection circuit 110 draws power from direct current (DC) bus 120 via connection 115. The circuit is also connected to ground bus 125.

Suppose, as an example, that module 102 became shaded or obscured by dirt or bird droppings. The module's output would be diminished and the voltage drop across the module would decrease. The total voltage across the string and injection circuit would still equal the difference between the voltage of DC bus 120 and ground 125, however. Therefore, without injection circuit 110, other modules (besides 102) in the string would be forced to operate at higher than optimum voltages. Injection circuit 110 prevents this situation by replacing in the string the power that would normally be generated by impaired module 102.

Continuing the example, suppose that the normal output power of STRING N is 2000 Watts, that there are ten modules in STRING N, and that module 102 normally provides 200 Watts, but is degraded to zero Watts. In this case, injection circuit 110 supplies the 200 Watts lost from module 102. If injection circuit 110 is 95% efficient, then only 10 Watts are dissipated in the injection circuit. The remaining 190 Watts are combined with the output of the other nine modules. Inefficiencies in the injection circuit lead to relatively small power dissipation because the amount of power in the circuit is much smaller than the power generated by the string to which it is attached.

The injection circuit supplies the power lost from degraded modules. However, the benefit to the string is obtained because the other modules remain at their maximum power point rather than being forced to operate at non-optimum voltages. Power injected by the injection circuit is not dissipated (excepting inefficiency of non-ideal circuit elements), but rather combined with the output of fully operational modules. The power in the injection circuit is much less than the power generated by the string as a whole.

Figure 2:
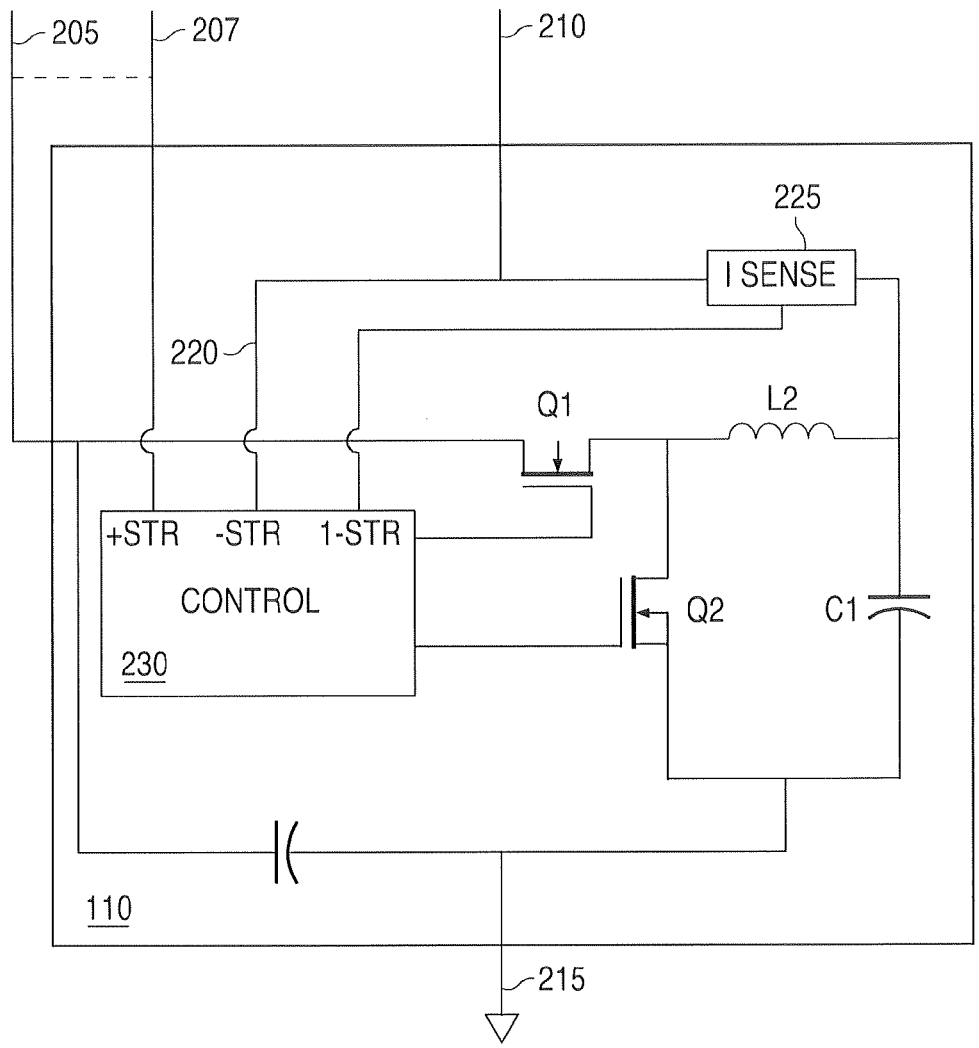
FIG. 2 shows an example of an injection circuit.

FIG. 2 shows one possible embodiment of an injection circuit in more detail. In FIG. 2, injection circuit 110 has four external connections: line 205 is connected to a power source, lines 207 and 210 are connected to positive and negative ends, respectively, of a string of photovoltaic modules, and line 215 is connected to ground. When the circuit is configured as shown in FIG. 1A, the external power source connected to line 205 is DC bus 120. In this case, lines 205 and 207 may be connected together as indicated by dashed lines in the figure. However, another external power source could be used instead of DC bus 120. Then, line 205 carries power input while line 207 is used to sense the voltage across a string.

Injection circuit 110 tracks the power flowing in a string of solar modules connected to line 210 by monitoring the voltage across the string and the current flowing through it. (The voltage is measured between lines 207 and 210, while the current is sensed in block 225 which may be a Hall Effect sensor, a voltage measurement across a shunt resistor, or other current sensing mechanism.) If the power drops, the circuit operates to switch capacitor C1 into the string and to adjust the voltage across C1 until the power is maximized. Transistors Q1 and Q2 switch current to alternately store energy in inductor L2 and then discharge the energy into capacitor C1. Those skilled in the art will recognize that Q1, Q2, L2 and C1 are elements of a synchronous buck converter circuit. Many other circuit designs are possible, such as an asynchronous buck converter circuit in which Q2 is replaced by a diode, or a boost converter circuit.

Injection circuit 110 includes a control circuit 230. The control circuit tracks the power generated by a string of modules and maximizes the power via oscillator or timing electronics that switch transistors such as Q1 and Q2 illustrated in FIG. 2. In a typical scenario a tracking loop operates at kilohertz rates. Those skilled in the art will recognize that the tracking functions of the injection circuit may be implemented in many variations using standard electronic techniques.

Returning now to single-string applications of injection circuits, FIG. 1B shows a single string of solar modules connected in series with an injection circuit. In FIG. 1B photovoltaic modules 130, 132, 134 . . . 138 are connected in series with injection circuit 140. One end of the string provides DC output 150 while the other is connected to ground 155. Injection circuit 140 is shown connected at one end of the single photovoltaic string; however, it could be inserted anywhere in the string. Injection circuit 140 is connected to an external power source 145.

In normal operation the string of modules shown in FIG. 1B provides a certain power output. However, if one of the modules is impaired, injection circuit 140 injects power into the string equivalent to the power lost due to module impairment. Injection circuit 140 may be provided with control and feedback circuits that continuously adjust the injected power so as to maximize the power generated by the string.

Figure 1C:
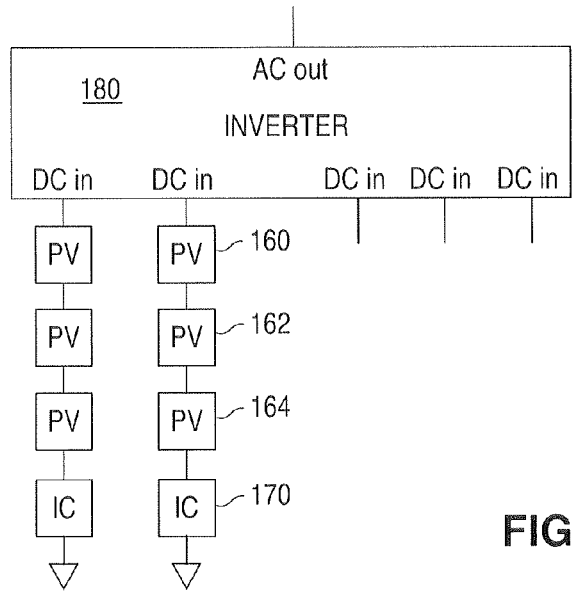
FIG. 1C shows a DC-to-AC inverter to which single strings of solar modules are connected. Each string is connected in series with an injection circuit.
Figure 1D:
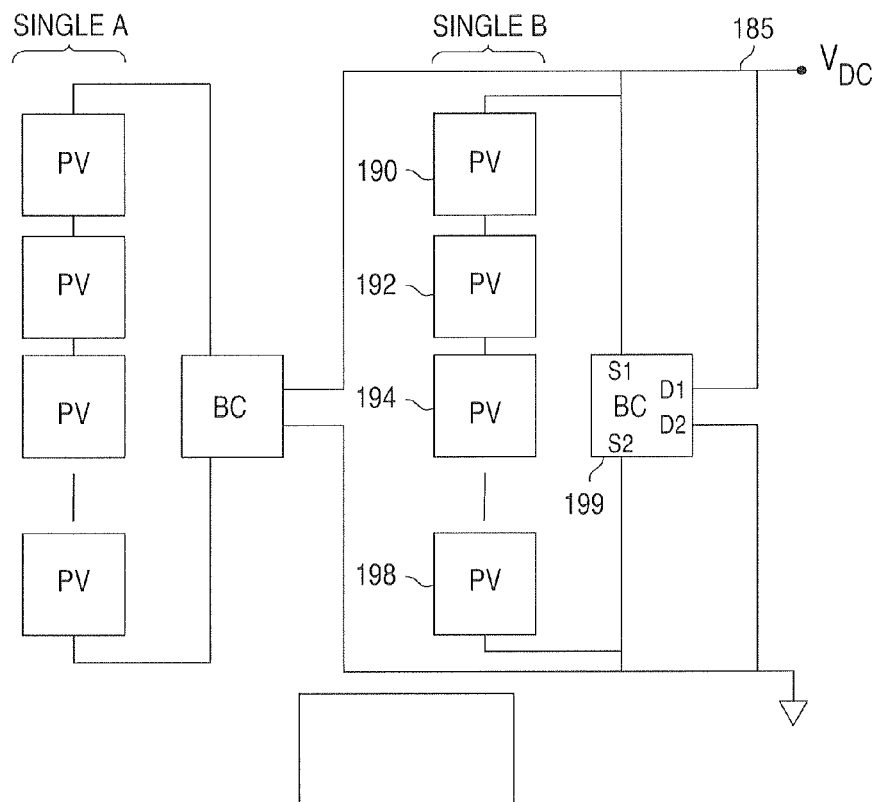
FIG. 1D shows a system in which strings in an array are equipped with boost circuits.

FIG. 1C shows an application of single strings of modules with injection circuits in which several such strings are connected to a DC-to-AC inverter. In FIG. 1C inverter 180 has several "DC in" connections, two of which are connected to strings of solar modules having injection circuits. One string, for example, includes modules 160, 162 and 164 connected in series with injection circuit 170. Circuit 170 may be connected to an external power source in analogy to source 145 of FIG. 1B (not shown in FIG. 1C) or to power provided by inverter 180. Additional strings, with or without injection circuits may be connected to other "DC in" inputs of the inverter.

When strings having injection circuits are connected to an inverter as shown in FIG. 1C, each string provides its own maximum power point tracking. Inverter 180, therefore, can use a relatively simple design without internal maximum power point tracking or voltage boost circuits. Further, inverter 180 can be built to handle large amounts of power and to accept input from a large number of strings. Inverter circuits are generally more cost effective when built for high power applications. Finally, the inverter need only accept a narrow range of input voltages. Hence, the system of FIG. 1C allows a large, but inflexible inverter design to be used with strings that provide their own maximum power point tracking on a string-by-string basis and also all output the same voltage.

We now consider an application involving injection circuits used to reduce the power output from strings of cells.

FIG. 1A shows strings of solar modules connected in parallel, each string having an injection circuit. In addition to the power control circuitry described above, each injection circuit contains a means to communicate with a central control point. This communication means can be wireless, data line or power line. The central control point transmits commands to all injection circuits specifying the maximum rate of change that should be allowed; if the power available from the sun increases at a rate higher than the specified rate, the injection circuits reduce the power output from their string by a gradually decreasing amount until the string's maximum power point is reached.

An injection circuit connected in series with a string of cells provides a general way to tune the amount of power produced by the string by injecting a small amount of power from an external source into the string. Injection circuits may be used when several strings are connected in parallel or with single strings. External power may be provided by a DC bus or from any other power source.

Although injection circuits have been described in terms of maximizing power in a string, they may also be used to set the power generated by a string to less than its maximum value. Adjustments to the injected power result in changes in the total output power. Injected power may increase or decrease the output power of a string. In this way, an injection circuit may be used as a general power control device.

Thus disclosed are apparatuses and methods to manage the effects of variations in strings of cells that are connected in parallel to form an array. The apparatus or methods may permit strings of cells to operate at their maximum power point even when one or more cells in a string are impaired by shade, dirt or other factors, or when Also disclosed are strings of cells that provide their own maximum power point tracking. Such strings may be connected to an inexpensive inverter and the number of strings connected need not be known at the time the inverter is manufactured or installed.

More generally, systems and methods are disclosed that maximize the output power of a string even when it is connected to a load that sets the voltage across the string to a fixed value.

Although injection circuits have been described in terms of applications in solar power generation, they are also generally applicable to electric power generating arrays comprising strings of batteries or other power sources. The injection circuit may be used to tune power sources in a string to operate at a desired power point.

As one skilled in the art will readily appreciate from the disclosure of the embodiments herein, processes, machines, manufacture, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, means, methods, or steps.

The above description of illustrated embodiments of the systems and methods is not intended to be exhaustive or to limit the systems and methods to the precise form disclosed. While specific embodiments of, and examples for, the systems and methods are described herein for illustrative purposes, various equivalent modifications are possible within the scope of the systems and methods, as those skilled in the relevant art will recognize. The teachings of the systems and methods provided herein can be applied to other systems and methods, not only for the systems and methods described above.

In general, in the following claims, the terms used should not be construed to limit the systems and methods to the specific embodiments disclosed in the specification and the claims, but should be construed to include all systems that operate under the claims. Accordingly, the systems and methods are not limited by the disclosure, but instead the scope of the systems and methods are to be determined entirely by the claims.

As used herein, the term "embodiment" means an embodiment that serves to illustrate by way of example but not limitation. It will be appreciated to those skilled in the art that the preceding examples and embodiments are exemplary and not limiting to the scope of the present invention. It is intended that all permutations, enhancements, equivalents, and improvements thereto that are apparent to those skilled in the art upon a reading of the specification and a study of the drawings are included within the true spirit and scope of the present invention. It is therefore intended that the following appended claims include all such modifications, permutations and equivalents as fall within the true spirit and scope of the present invention.

What is claimed is:

1. A solar power generation system comprising:
    at least one string of solar modules, the modules connected in series to a direct current (DC) bus;
    each module to generate a module power output through the string to the DC bus, and to operate at a pre-defined module output power point when unimpaired; and
    an injection circuit connected in series with the at least one string of modules, to selectively inject power into the string when one or more modules in the string generates an impaired module power output.

2. The system of claim 1, the injection circuit to inject power from one of: (a) the DC bus, and (b) a power source external to the solar power generation system.

3. The system of claim 1, wherein impairment of module power output of a module results from a reduction in solar energy reaching that module caused by at least one of: (a) shade, and (b) cloud cover.

4. The system of claim 1, the injection circuit including a power tracking unit to measure voltage across the string, and current through the string.

5. The system of claim 1, the injection circuit including a buck power converter circuit.

6. The system of claim 1, further comprising:
    a direct current (DC) to alternating current (AC) inverter connected to the DC bus.

7. The system of claim 6, further comprising:
    at least a second string of solar modules connected in series to the DC bus, and a corresponding second injection circuit connected in series with the second string of modules; and
    a central control unit coupled to the inverter;
    each injection circuit including a communication unit to communicate with the central control unit.

8. An apparatus for use in a solar power generation system including at least one string of solar modules connected in series to a direct current (DC) bus, each module operable to generate a module power output through the string to the DC bus, including a module power output at a pre-defined module output power point when unimpaired, the apparatus comprising:
    a power injection unit connectable to the string of modules, in series with the modules, the injection unit including
    detection circuitry to detect a string operating condition representative of module power output for modules in the string, including to detect an impairment condition indicating that at least one module in the string is generating an impaired module power output; and
    injection circuitry to selectively inject power into the string when the detection circuitry detects the impairment condition.

9. The apparatus of claim 8, the injection circuitry to inject power from one of: (a) the DC bus, and (b) a power source external to the solar power generation system.

10. The apparatus of claim 8, wherein impairment of module power output of a module results from a reduction in solar energy reaching that module caused by at least one of: (a) shade, and (b) cloud cover.

11. The apparatus of claim 8, the detection circuitry to measure a string operating condition corresponding to voltage across the string, and current through the string.

12. The apparatus of claim 8, the injection circuitry including a buck converter circuit.

13. The apparatus of claim 8:
wherein the solar power generation system further comprises:
a direct current (DC) to alternating current (AC) inverter connected to the DC bus, and
a central control unit coupled to the inverter; and
wherein the injection circuitry includes a communication unit to communicate with the central control unit.

14. The system of claim 1, the injection circuit to selectively inject power into the string when one or more modules in the string generates an impaired module power output, such that each unimpaired module operates substantially at the associated pre-defined module output power point.

15. The apparatus of claim 8, the injection circuitry to selectively inject power into the string, such that each unimpaired module operates substantially at the associated pre-defined module output power point.

16. A method for controlling solar power generation in a solar power generation system including at least one string of solar modules connected in series to a direct current (DC) bus, each module operable to generate a module power output through the string to the DC bus, and to operate at a module output power point when unimpaired, the method comprising:
detecting a string operating condition representative of module power output for modules in the string, including a string operating condition in which each module is operating at a pre-defined module output power output point when unimpaired;
detecting an impairment condition indicating that at least one module in the string is generating an impaired module power output; and
when the impairment condition is detected, selectively injecting power into the string independent of the module power output for the modules in the string, by means of an injection circuit connected in series with the at least one string of modules.

17. The method of claim 16, wherein power is injected into the string when the impairment condition is detected such that each unimpaired module operates substantially at the associated pre-defined module output power point.

18. The method of claim 16, wherein power is injected into the string when the impairment condition is detected from one of: (a) the DC bus, and (b) a power source external to the solar power generation system.

19. The method of claim 16 wherein detecting a string operating condition is based on at least one of voltage across the string, and current through the string.

20. The method of claim 16, wherein the solar power generation system includes a direct current (DC) to alternating current (AC) inverter connected to the DC bus, and a central control unit coupled to the inverter, the method further comprising:
communicating power injection status to the central control unit.

* * * * *